United States Patent
Inagawa et al.

(10) Patent No.: US 7,429,718 B2
(45) Date of Patent: Sep. 30, 2008

(54) HEATING AND COOLING OF SUBSTRATE SUPPORT

(75) Inventors: Makoto Inagawa, Palo Alto, CA (US); Akihiro Hosokawa, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 110 days.

(21) Appl. No.: 11/213,348

(22) Filed: Aug. 24, 2005

(65) Prior Publication Data

US 2007/0029642 A1  Feb. 8, 2007

Related U.S. Application Data

(60) Provisional application No. 60/705,031, filed on Aug. 2, 2005.

(51) Int. Cl.
*H05B 3/68* (2006.01)
*C23C 16/00* (2006.01)

(52) U.S. Cl. ........... 219/444.1; 219/443.1; 219/390; 219/405; 219/411; 392/416; 392/418; 118/725; 118/50.1; 118/728; 118/729

(58) Field of Classification Search ........ 219/444.1, 219/443.1, 390, 405, 411; 392/416, 418; 118/724, 725, 50.1, 728, 729
See application file for complete search history.

(56) References Cited

U.S. PATENT DOCUMENTS

| | | | |
|---|---|---|---|
| 3,895,216 A * | 7/1975 | Hurko | 219/458.1 |
| 5,033,538 A | 7/1991 | Wagner et al. | |
| 5,059,770 A | 10/1991 | Mahawili | |
| 5,180,000 A | 1/1993 | Wagner et al. | |
| 5,238,499 A | 8/1993 | Van De Ven | |
| 5,511,608 A | 4/1996 | Boyd | |
| 5,516,367 A | 5/1996 | Lei et al. | |
| 5,595,241 A | 1/1997 | Jelinck | |
| 5,844,205 A | 12/1998 | White et al. | |
| 6,035,101 A | 3/2000 | Sajoto et al. | |
| 6,087,632 A | 7/2000 | Mizosaki et al. | |
| 6,371,357 B1 | 4/2002 | Watanabe | |
| 6,376,815 B1 | 4/2002 | Watanabe | |
| 6,477,980 B1 | 11/2002 | White et al. | |
| 6,500,356 B2 | 12/2002 | Goto et al. | |
| 6,552,311 B2 | 4/2003 | Watanabe | |
| 6,557,747 B2 | 5/2003 | Watanabe | |
| 6,660,975 B2 | 12/2003 | Wang et al. | |
| 6,825,617 B2 * | 11/2004 | Kanno et al. | 315/111.21 |
| 6,900,413 B2 * | 5/2005 | Ratliff et al. | 219/390 |
| 2003/0044621 A1 | 3/2003 | Won et al. | |

* cited by examiner

*Primary Examiner*—Shawntina Fuqua
(74) *Attorney, Agent, or Firm*—Patterson & Sheridan LLP

(57) ABSTRACT

A substrate support assembly and method for controlling the temperature of a substrate within a process chamber are provided. A substrate support assembly includes an thermally conductive body comprising a stainless steel material, a substrate support surface on the surface of the thermally conductive body and adapted to support a large area substrate thereon, one or more heating elements embedded within the thermally conductive body, a cooling plate positioned below the thermally conductive body, a base support structure comprising a stainless steel material, positioned below the cooling plate and adapted to structurally support the thermally conductive body, and one or more cooling channels adapted to be supported by the base support structure and positioned between the cooling plate and the base support structure. A process chamber comprising the substrate support assembly of the invention is also provided.

6 Claims, 9 Drawing Sheets

HEATING AND COOLING OF SUBSTRATE SUPPORT

CROSS-REFERENCE TO RELATED APPLICATIONS

This application claims benefit of U.S. provisional patent application Ser. No. 60/705,031 (AMAT/10232L), filed Aug. 2, 2005, which is herein incorporated by reference.

BACKGROUND OF THE INVENTION

1. Field of the Invention

Embodiments of the invention generally provide a substrate support utilized in flat panel substrate processing.

2. Description of the Related Art

Liquid crystal displays or flat panel displays (FPD) are commonly used for active matrix displays such as computer and television monitors, personal digital assistants (PDAs), and cell phones, as well as solar cells and the like. Generally, a flat panel display comprises two glass plates having a layer of liquid crystal material sandwiched therebetween. At least one of the glass plates includes at least one conductive film disposed thereon that is coupled to a power supply. Power supplied to the conductive film from the power supply changes the orientation of the crystal material, creating a pattern such as texts or graphics on the flat panel displays. Generally, substrates utilized for flat panel fabrication are large in size, often exceeding 550 mm×650 mm, and are envisioned up to and beyond 4 square meters in surface area. Correspondingly, the substrate supports utilized to process large area substrates are proportionately large to accommodate the large surface area of the substrate.

Fabrication processes frequently employed to produce flat panel displays include chemical vapor deposition (CVD) and physical vapor deposition (PVD). Among them, plasma enhanced chemical vapor deposition (PECVD) for depositing thin film on a substrate is generally accomplished by introducing a precursor gas into a vacuum process chamber to be energized (e.g., excited) into a plasma. FIG. 1 is a schematic cross-sectional view of a process chamber 2 having a temperature controlled substrate support or susceptor 22 disposed therein to support a substrate. Reactive precursor gases, flowing into a gas manifold 16 through a gas inlet 14, a blocker plate 44 and a face plate 52 near the top of the process chamber 2, are excited to form a layer of material on the surface of the substrate. An opening 10 disposed in the sidewall allows a robot (not shown) to deliver and retrieve the substrate to and from the process chamber 2 by coordinating with a plurality of substrate support pins 24. The substrate support pins 24 are movably supported by a substrate pin plate 42 and are capable of passing through the susceptor 22 and moving up to receive the substrate to be delivered or retrieved by the robot. The susceptor 22, as supported by a shaft 20 and a lift mechanism, historically has been made of a single rectangular plate of aluminum and is typically heated by an embedded heater 32 with thermocouples and energy supplied from a power source 26.

Generally, the susceptor 22 of the process chamber 2 may be heated from room temperature to a high temperature of about 500° C. or less, and the susceptor 22 can defied and "droop" without adequate support. A substrate supported by the susceptor is prone to conform to the susceptor and, thus, also deflects. As a result, the vertical spacing between the gas manifold 16 and the substrate varies between central portions and the perimeter of the substrate, resulting in large degree of deflection or sagging and, thus, a greater distance near its perimeter. The difference in the vertical spacing (i.e., substrate deflection distance) greatly decreases uniformity of the deposited films disposed on the large area substrate.

Physical vapor deposition (PVD), or sputtering, is a plasma process performed in a vacuum process chamber where a negatively biased target with respect to a chamber body or a grounded sputter shield is exposed to a plasma of a gas mixture. Bombardment of the target by ions of the gas mixture results in ejection of atoms of the target material. The ejected atoms accumulate as a layer of deposited film on a substrate placed on a substrate support disposed within the PVD chamber.

A PVD process for flat panel fabrication generally operates at a lower temperature range which is about 200° C. lower than a CVD process. Thus, cooling, in addition to heating, of the substrate support for a PVD chamber is required. Especially after striking a plasma inside a PVD chamber, the energy from the plasma also creates heat directed to the substrate and the substrate support. Therefore, there is a problem of a temporal temperature increase or spike (e.g., about 30-50° C. increase from 150° C.) for the processing substrate disposed on the substrate support inside the PVD chamber. Such drastic temperature variation needs to be controlled in order to maintain a constant temperature on the substrate being processed. In addition, cooling of the substrate support of a PVD chamber is also needed after sputtering and during chamber part maintenance. However, for such a large area substrate, the performance of most cooling designs inside a PVD substrate support is not very good and there is a problem of too much local cooling which also leads to local temperature variations over a large area substrate. As a result, variations in film thickness, often manifesting as spots of thinner film thickness, have been observed, which is detrimental to the next generation of flat panel or solar cell devices.

Therefore, there is a need for an improved method and apparatus to control the temperature of a substrate support constantly to a desired range.

SUMMARY OF THE INVENTION

Embodiments of a process chamber, substrate support assembly, and method for controlling the temperature of a substrate within a process chamber are provided. In one embodiment of the invention, a substrate support assembly includes an thermally conductive body comprising a stainless steel material, a substrate support surface on the surface of the thermally conductive body and adapted to support a large area substrate thereon, one or more heating elements embedded within the thermally conductive body, a cooling plate positioned below the thermally conductive body, a base support structure comprising a stainless steel material, positioned below the cooling plate and adapted to structurally support the thermally conductive body, and one or more cooling channels adapted to be supported by the base support structure and positioned between the cooling plate and the base support structure. In another embodiment, a process chamber including a chamber body, a target assembly and a substrate support assembly for supporting a large area substrate is provided.

In yet another embodiment, a method for maintaining the temperature of a large area substrate within a process chamber includes positioning the large area substrate on a substrate support surface of a substrate support assembly of the process chamber. The substrate support assembly includes an thermally conductive body, a substrate support surface on the surface of the thermally conductive body, one or more heating elements, a cooling plate positioned below the thermally conductive body, a base support structure positioned below the cooling plate and adapted to structurally support the thermally conductive body, and one or more cooling channels adapted to be supported by the base support structure and positioned between the cooling plate and the base support structure. The method further includes increasing the temperature of the large area substrate by heating the one or more heating elements, decreasing the temperature of the large area substrate by flowing cooling fluids inside the one or more cooling channels, and maintaining the temperature of the large area substrate by controlling the flow rate of the cooling fluids inside the one or more cooling channels.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. To facilitate understanding, identical reference numerals have been used, where possible, to designate identical elements that are common to the figures.

DETAILED DESCRIPTION

Figure 1:
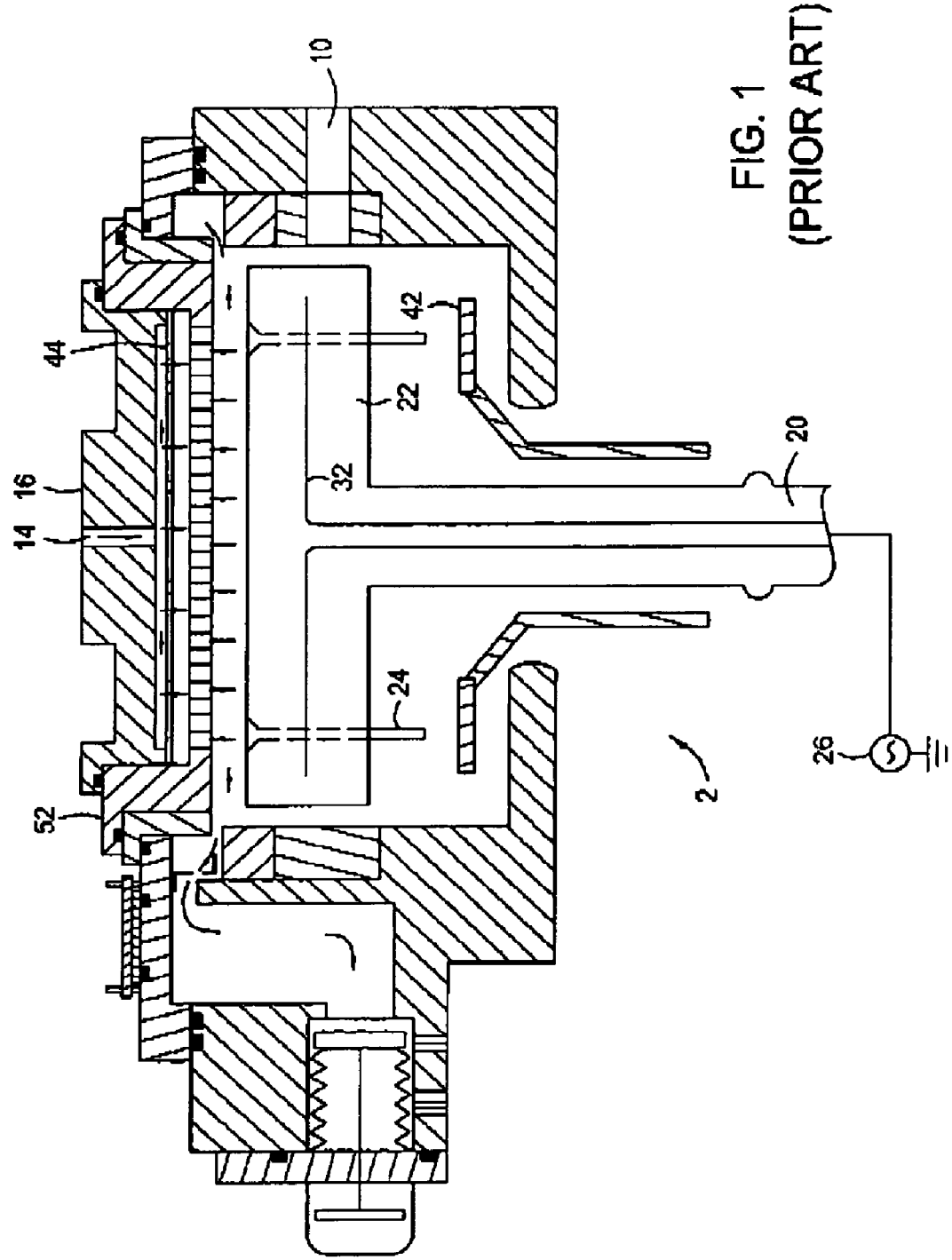
FIG. 1 depicts a schematic sectional view of a substrate support in a CVD process chamber.
Figure 2:
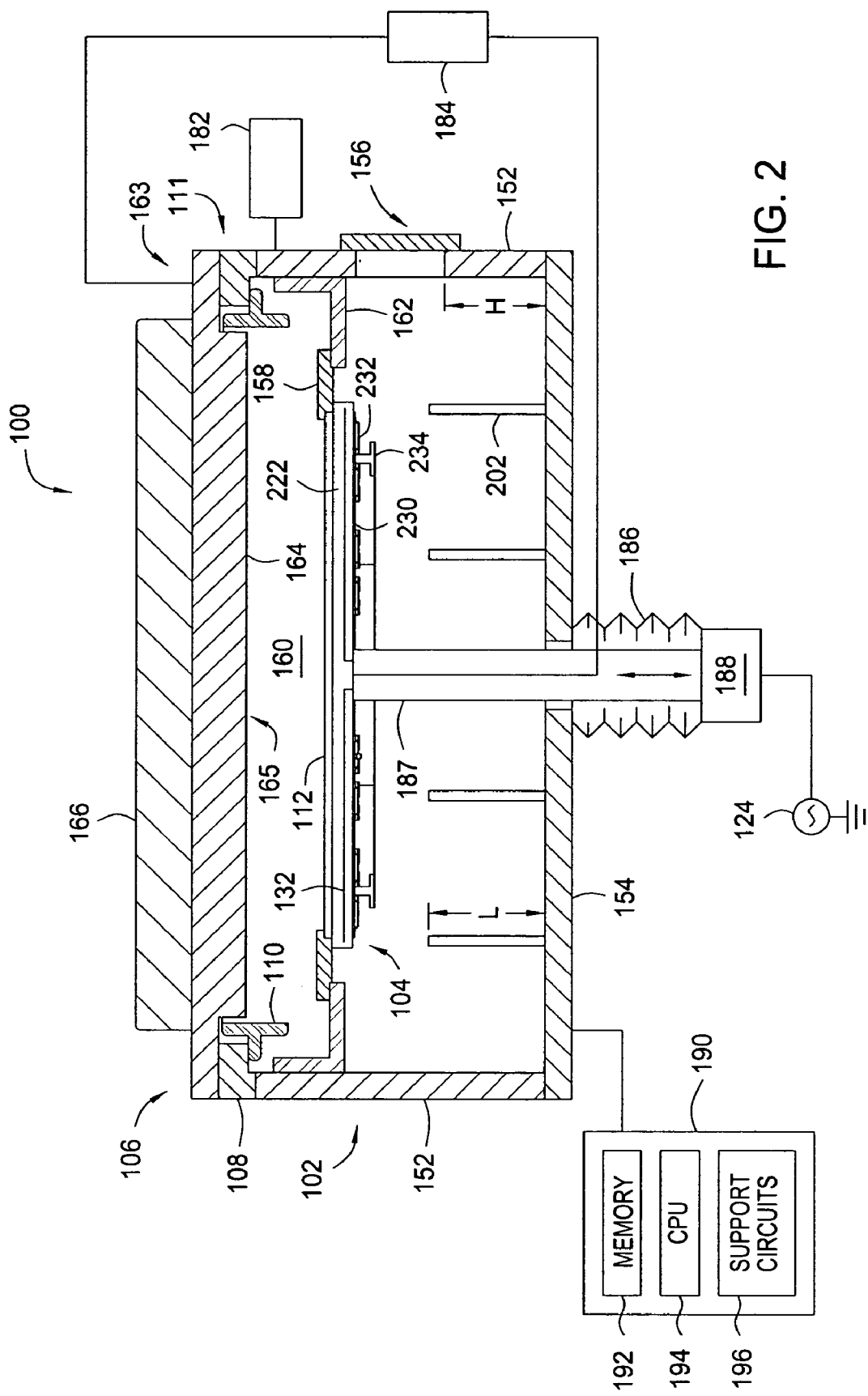
FIG. 2 depicts a schematic sectional view of one embodiment of a process chamber having a substrate support assembly of the invention.
Figure 3:
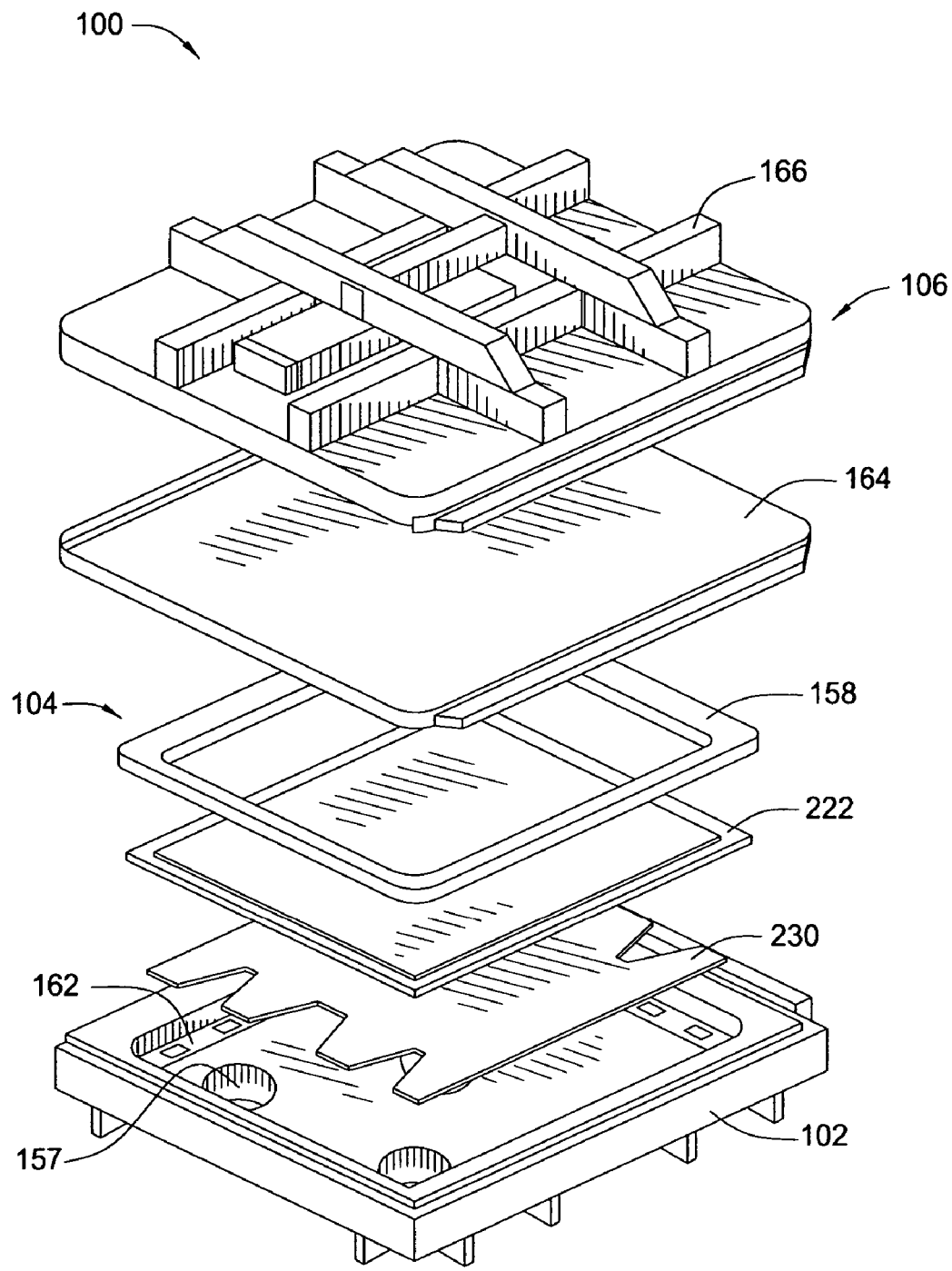
FIG. 3 is an exploded perspective view of a process chamber in accordance with one embodiment of the invention.

The invention provides a substrate support assembly and method for controlling the temperature of a substrate within a process chamber on a large area substrate. FIGS. 2 and 3 illustrate an exemplary process chamber 100 in accordance with one or more embodiments of the invention. The invention is illustratively described below in reference to a physical vapor deposition process chamber for processing large area substrates, such as those available from AKT, a division of Applied Materials, Inc., Santa Clara, Calif. However, it should be understood that the invention has utility in other system configurations such as physical vapor deposition systems, ion implant systems, etch systems, chemical vapor deposition systems, and any other system in which controlling the temperature of a substrate on a substrate support within a process chamber is desired.

The process chamber 100 includes a lid assembly 106, a substrate support assembly 104, and a chamber body 102 defining a process volume 160. The chamber body 102 generally includes chamber sidewalls 152 and a chamber bottom 154. The lid assembly 106 generally includes a target 164 and a ground shield assembly 111 coupled thereto. Optionally, the lid assembly 106 may further comprise a magnetron assembly 166, which enhances consumption of the target material during processing. Examples of the magnetron assembly include a linear magnetron, a serpentine magnetron, a spiral magnetron, a double-digitated magnetron, a rectangularized spiral magnetron, among others.

The target 164 provides a material source that can be deposited onto the surface of a substrate 112 during a PVD process. The target 164 or target plate may be fabricated of a material that will become the deposition species or it may contain a coating of the deposition species. To facilitate sputtering, a high voltage power supply, such as a power source 184 is connected to the target 164 and to the substrate support assembly 104.

The target 164 generally includes a peripheral portion 163 and a central portion 165. The peripheral portion 163 is disposed over the chamber sidewalls 152 of the chamber. The central portion 165 of the target 164 may protrude, or extend in a direction towards the substrate support assembly 104. It is contemplated that other target configurations may be utilized as well. For example, the target 164 may comprise a backing plate having a central portion of a desired material bonded or attached thereto. The target material may also comprise adjacent tiles or segments of material that together form the target.

During a sputtering process to deposit a material on the substrate 112, the target 164 and the substrate support assembly 104 are biased relative each other by the power source 184. A process gas, such as inert gas and other gases, e.g., argon, and nitrogen, is supplied to the process volume 160 from a gas source 182 through one or more apertures (not shown), typically formed in the chamber sidewalls 152 of the process chamber 100. The process gas is ignited into a plasma and ions within the plasma are accelerated toward the target 164 to cause target material to be dislodged from the target 164 into particles. The dislodged material or particles are attracted towards the substrate 112 through the applied bias, depositing a film of material onto the substrate 112.

The ground shield assembly 111 includes a ground frame 108, a ground shield 110, or any chamber shield member, target shield member, dark space shield, dark space shield frame, etc. The ground shield 110 surrounds the central portion 165 of the target 164 to define a processing region within the process volume 160 and is coupled to the peripheral portion 163 of the target 164 by the ground frame 108. The ground frame 108 electrically insulates the ground shield 110 from the target 164 while providing a ground path to the chamber body 102 of the process chamber 100 (typically through the sidewalls 152). The ground shield 110 constrains the plasma within the region circumscribed by the ground shield 110 to ensure that target source material is only dislodged from the central portion 165 of the target 164. The ground shield 110 may also facilitate depositing the dislodged target source material mainly on the substrate 112. This maximizes the efficient use of the target material as well as protects other regions of the chamber body 102 from deposition or attack from the dislodged species or from the plasma, thereby enhancing chamber longevity and reducing the downtime and cost required to clean or otherwise maintain the chamber. The ground shield 110 may be formed of one or more work-piece fragments and/or one or more corner pieces, and a number of these pieces are bonded together, using bonding processes known in the art, such as welding, gluing, high pressure compression, etc.

The substrate support assembly 104 is generally disposed on the chamber bottom 154 of the chamber body 102. The substrate support assembly 104 may include a plate-like body, such as a susceptor 222, which is thermally conductive to support and provide temperature control to the substrate 112 thereon during substrate processing within the process chamber 100. Suitable metal or metal alloy materials, such as stainless steel, aluminum, etc., are used to manufacture the body of the susceptor 222. The susceptor 222 can be made of a metal material that is heat resistant, such as those having a lower thermal expansion coefficient, e.g., lower than that of aluminum. In one embodiment, the susceptor 222 is made of a stainless steel material. However, other suitable materials can also be used.

A shaft 187 extends through the chamber bottom 154 of the chamber body 102 and couples the substrate support assembly 104 to a lift mechanism 188. The lift mechanism 188 is configured to move the substrate support assembly 104 between a lower substrate loading/unloading position and an upper substrate processing position. The substrate support assembly 104 is depicted in an intermediate position in FIG. 2. A bellows 186 is typically disposed between the substrate support assembly 104 and the chamber bottom 154 and provides a flexible seal therebetween, thereby maintaining vacuum integrity of the process volume 160.

Figure 4:
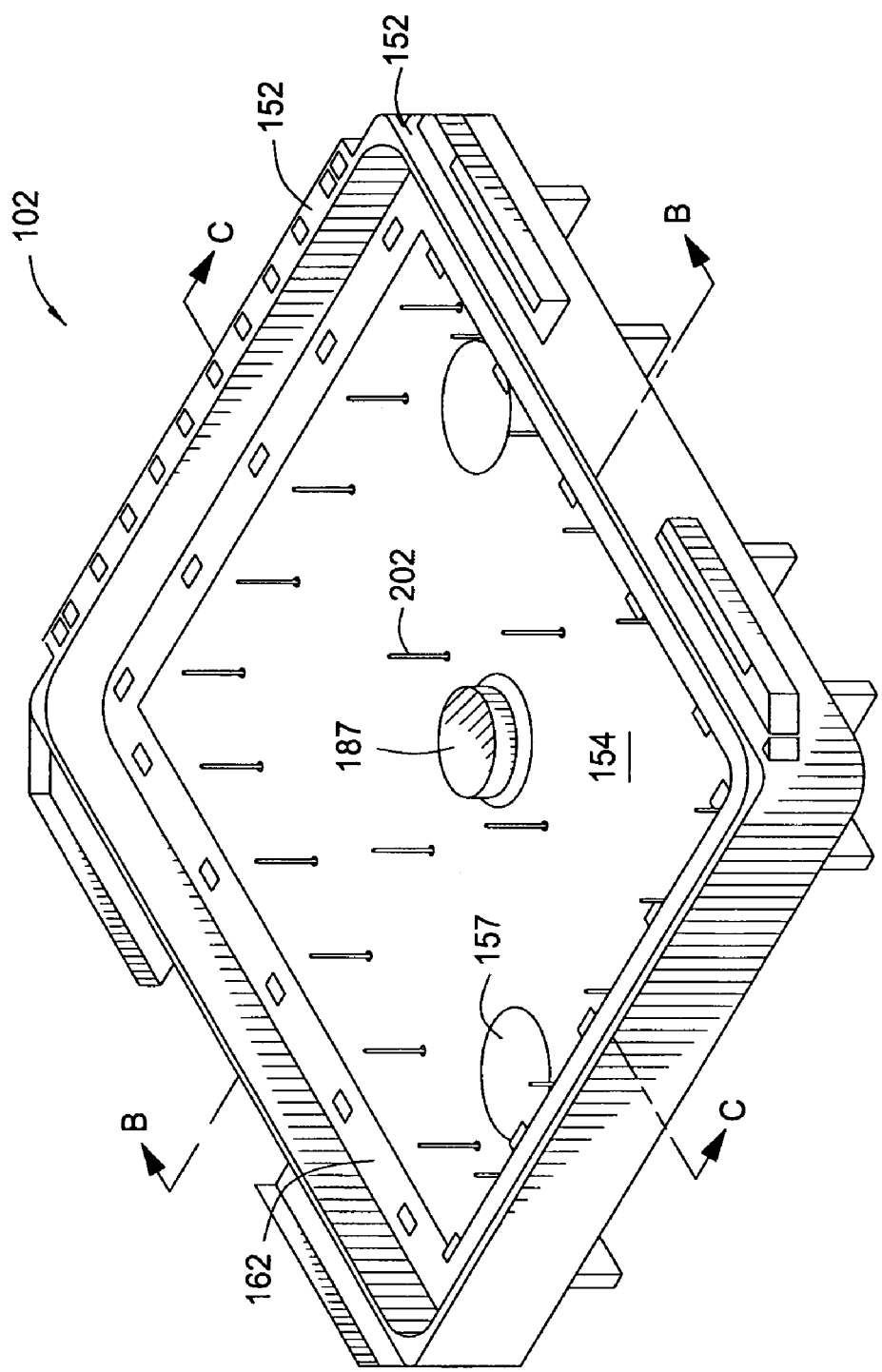
FIG. 4 is a sectional view of a chamber body in accordance with one embodiment of the invention.

FIG. 4 is a sectional view of the chamber body 102 in accordance with one or more aspects of the invention. The chamber body 102 is typically fabricated from metal or metal alloy materials, such as a unitary block of aluminum or welded stainless steel plates. The chamber body 102, the chamber sidewalls 152, and/or the chamber bottom 154 generally include a plurality of apertures, such as an access port 156 and a pumping port 157. The pumping port 157 is coupled to a pumping device (not shown), such as a cryogenic pump, a dry pump, a roughing pump, a turbo pump, and a cryogenic pump, among others, which evacuates and controls the pressure within the process volume 160. The pumping device is able to maintain the pressure of the process chamber 100 to a high vacuum level. For example, the pressure level of the process chamber 100 can be maintained to about 1 Torr or less, such as at about $10^{-3}$ Torr or less, at about $10^{-5}$ Torr to about $10^{-7}$ Torr, or at about $10^{-7}$ Torr or less.

The access port 156 is sealable, such as by a slit valve, a gate valve, or other vacuum sealable assembly, and may be coupled to a transfer chamber of a cluster substrate processing system to provide entrance and egress of the substrate 112 (e.g., a flat panel display substrate or a semiconductor wafer) into and out of the process chamber 100. Other apertures may also optionally be formed on the chamber sidewalls 152 and/or the chamber bottom 154 of the chamber body 102.

According to one or more embodiment of the invention, the chamber bottom 154 of the chamber body 102 may further include a plurality of substrate support pins 202 to support the substrate 112 being transferred into and out of the process chamber 100 through the access port 156. The substrate support pins 202 are able to pass through a plurality of substrate support pin holes 204 on the susceptor 222 in order to receive the substrate 112 above the susceptor 222 when the susceptor 222 is moved down to the lower substrate loading/unloading position. The substrate support pins 202 facilitate the placement or removal of the substrate 112 by a transfer robot or other transfer mechanism disposed exterior to the process chamber 100 and entered through the access port 156. The substrate support pins 202 generally include a length "L" when attached on the chamber bottom 154. In one embodiment, the length "L" is larger than the height "H" between the chamber bottom 154 and the access port 156 in order to provide space for loading and unloading the substrate 112 by the transfer robot.

The substrate support pins 202 can be made of a metal or a metal alloy material, such as aluminum, stainless steel, etc. Alternatively, the substrate support pins 202 can be made of an insulating material, such as ceramic materials, anodized aluminum oxides materials, among others. In one embodiment, the substrate support pins 202 are made of stainless steel material. The substrate support pins 202 can be attached or bonded to the chamber bottom 154 using mating, welding, and/or other alignment mechanisms known in the art. For example, the substrate support pins 202 may be attached to the chamber bottom 154 through male or female threading alignments and secured to a plurality of holes on the main body of the chamber bottom 154, thereby keeping the substrate 112 at a leveled position above the susceptor 222. Alternatively, the substrate support pins 202 may be supported by a movable support pin plate in order to be moved up and down to receive the substrate 112 thereon. Other configurations and positioning for the substrate support pins 202 can also be used.

As shown in FIG. 4, the substrate support pins 202 may need to be positioned at the peripheral portions of the chamber bottom 154, thus, near the perimeter of the substrate 112, in order to support the substrate 112. However, when a substrate of a very large dimension is placed on the substrate support pins 202 and/or the susoeptor 222, substrate deflection or sagging (i.e., change in vertical positions when placing the substrate flat) can occur. Thus, the invention provides additional substrate support pins 202 positioned spatially apart near the inner portions of the chamber bottom 154. In addition, the numbers and positions of the substrate support pins 202 and the substrate support pin holes 204 on the susceptor 222 are optimized such that substrate deflection or sagging is reduced without interfering with other components of the substrate support assembly 104. In one embodiment, the substrate support pins 202 are configured to be positioned equally apart along the edges of the chamber bottom 154 and distributed spatially in equal distances along two middle lines B-B and C-C of the chamber bottom 154 in order to minimize deflection and sagging of the substrate 112. FIG. 4 demonstrates one example of positioning the substrate support pins 202 at the respective locations.

As shown in FIGS. 2-4, a shadow frame 158 and a chamber shield 162 may be disposed within the chamber body 102. The shadow frame 158 is generally configured to confine deposition to a portion of the substrate 112 exposed through the center of the shadow frame 158. The shadow frame 158 can be formed of one piece or it can be two or more work-piece fragments bonded together in order to surround the peripheral portions of the substrate 112.

When the substrate support assembly 104 is moved to the upper substrate processing position, an outer edge of the substrate 112 disposed on the substrate support assembly 104 engages the shadow frame 158 and lifts the shadow frame 158 from the chamber shield 162. When the substrate support assembly 104 is moved into the lower substrate loading/unloading position, the substrate support assembly 104 is positioned below the chamber shield 162 and the access port 156. The substrate 112 may then be removed from or placed into the process chamber 100 through the access port 156 on the chamber sidewalls 152 using the transfer robot, and at this point, the substrate 112 can be temporarily supported by the substrate support pins 202.

In one embodiment, the substrate support assembly 104 of the process chamber 100 of the invention is adapted to process a rectangular substrate. The surface area of a rectangular substrate for flat panel display is typically large, for example, a rectangle of about one square meter or larger, such as at least about 370 mm by about 470 mm. For flat panel display application, the substrate 112 may comprise a material that is essentially optically transparent in the visible spectrum, for example glass or clear plastic. However, the invention is equally applicable to substrate processing of any types and sizes. Substrates of the invention can be circular, square, rectangular, or polygonal for flat panel display manufacturing. In addition, the invention applies to substrates for fabricating any devices, such as flat panel display (FPD), flexible display, organic light emitting diode (OLED) displays, flexible organic light emitting diode (FOLED) display, polymer light emitting diode (PLED) display, liquid crystal displays (LCD), organic thin film transistor, active matrix, passive matrix, top emission device, bottom emission device, solar cell, solar panel, etc., and can be on any of the silicon wafers, glass substrates, metal substrates, plastic films (e.g., polyethylene terephthalate (PET), polyethylene naphthalate (PEN), etc.), plastic epoxy films, among others.

The dimensions of the chamber body 102 and related components of the process chamber 100 are not limited and generally are proportionally larger than the size and dimension of the substrate 112 to be processed in the process chamber 100. For example, when processing a large area square substrate having a width of about 370 mm to about 2160 mm and a length of about 470 mm to about 2460 mm, the chamber body 102 may include a width of about 570 mm to about 2360 mm and a length of about 570 mm to about 2660 mm. As another example, when processing a substrate size of about 1950 mm×2250 mm, the chamber body 102 can have a cross sectional dimension of about 2700 mm×3000 mm.

Referring back to FIG. 2, a controller 190 is included to interface with and control various components of the process chamber 100. The controller 190 typically includes a central processing unit (CPU) 194, support circuits 196 and a memory 192. The CPU 194 may be one of any forms of computer processors that can be used in an industrial setting for controlling various chambers, apparatuses, and chamber peripherals. The memory 192, any software, or any computer-readable medium coupled to the CPU 194 may be one or more readily available memory devices, such as random access memory (RAM), read only memory (ROM), hard disk, CD, floppy disk, or any other form of digital storage, for local or remote for memory storage. The support circuits 196 are coupled to the CPU 194 for supporting the CPU 194 in a conventional manner. These circuits include cache, power supplies, clock circuits, input/output circuitry, subsystems, and the like.

PVD chambers that may be adapted to benefit from the invention are described in co-pending U.S. patent application Ser. Nos. 11/131,009 (docket number: AMAT/9566) filed on May 16, 2005, titled "Ground Shield for a PVD chamber" by Golubovsky, (docket number: AMAT/10169) titled "Integrated PVD System Using Designated PVD Chambers" by Hosokawa et al.; and (docket number: AMAT/10234), titled "Reinforced Chamber Bottom" by Inagawa et al., all of which are hereby incorporated by reference in their entireties.

Figure 5:
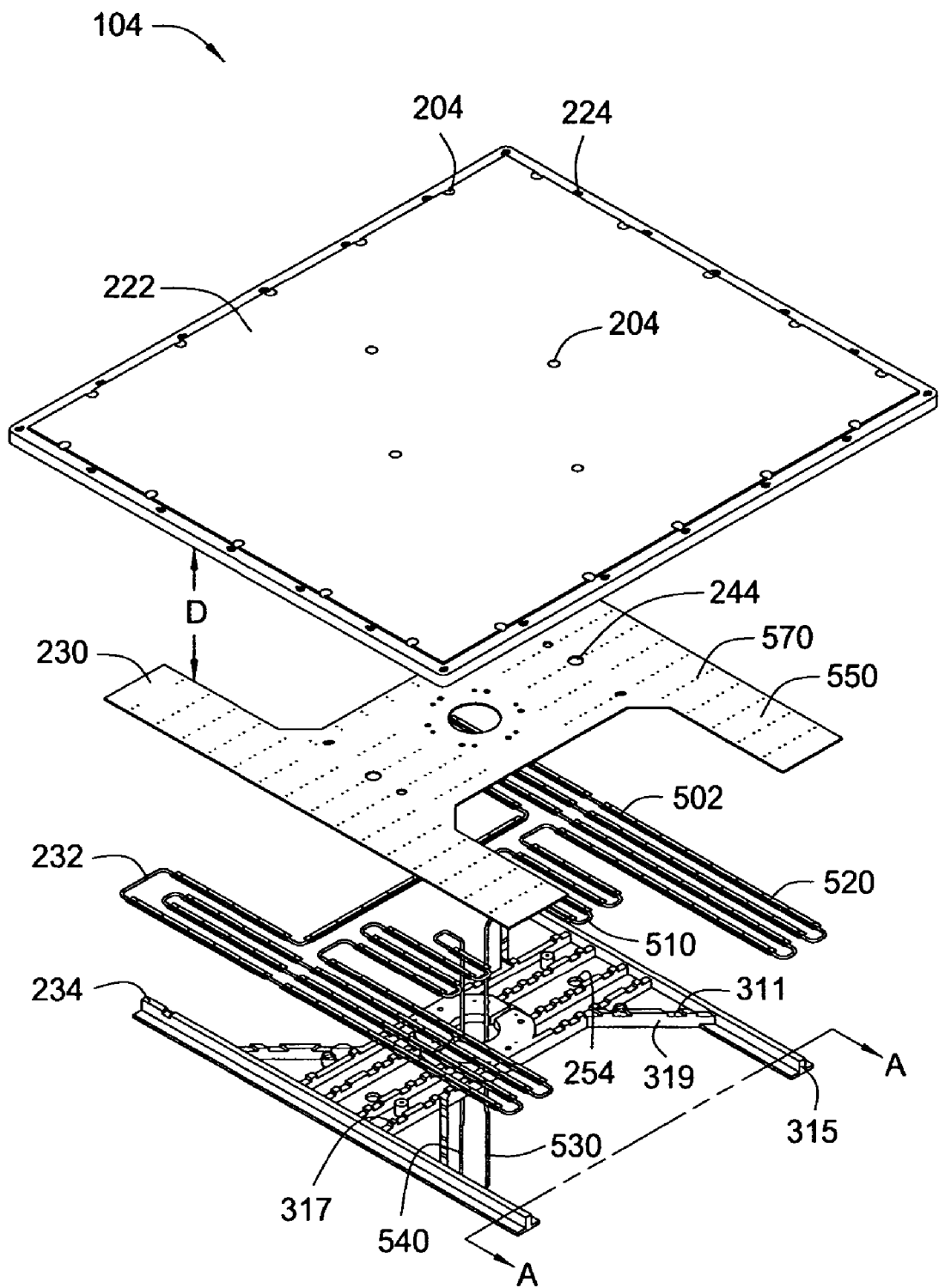
FIG. 5 is an exploded perspective view of a substrate support assembly in accordance with another embodiment of the invention.
Figure 6:
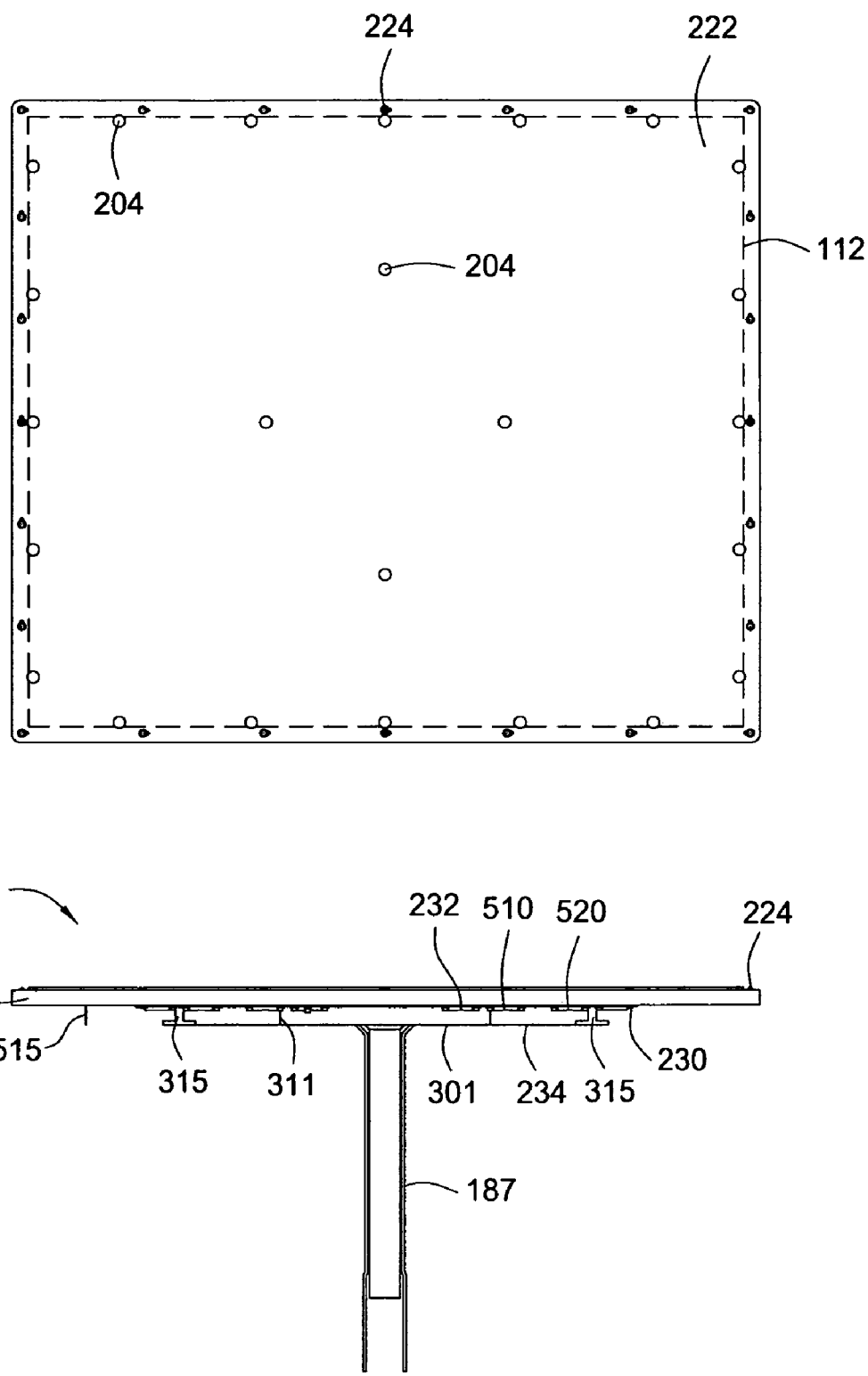
FIG. 6 is a planar view and a corresponding cross-sectional view of a substrate support assembly in accordance with embodiments of the invention.

FIG. 5 illustrates a perspective exploded view of the substrate support assembly 104 and FIG. 6 illustrate planar and cross sectional views of the substrate support assembly 104 through section A-A of FIG. 5, in accordance with one or more aspects of the invention. The substrate support assembly 104 of the invention may include the susceptor 222, the cooling plate 230, one or more cooling channels 232, and a susceptor base support structure 234.

The susceptor 222 of the invention includes one or more electrodes and/or heating elements 132 coupled to a heating power source 124 to controllably heat the substrate support assembly 104 and the substrate 112 positioned thereon to a predetermined temperature of about 60° C. or higher, such as between about 100° C. to about 200° C. For example, the one or more heating elements 132 may be made of channels or tubings of resistive heating coils surrounded by insulation materials with conductor lead wires attached to each ends of the one or more heating elements 132 near the center of the susceptor 222 in order to enter and exit through the shaft 187 and connected to the heating power source 124 to adjust heating of the susceptor 222. In one embodiment, the one or more heating elements 132 are embedded within the susceptor 222. Each of the one or more heating elements 132 is identical in construction and only differs in length and position within the susceptor 222 such that the one or more heating elements 132 are embedded across the large dimension of the susceptor 222. As shown in FIGS. 5 and 6, the one or more cooling channels 232, the cooling source of the process chamber 100, are positioned below and separate from the one or more heating elements 132 embedded in the susceptor 222, the heating source of the process chamber 100, in order to facilitate substrate temperature control without interfering with each other.

Figures 7A, 7B:
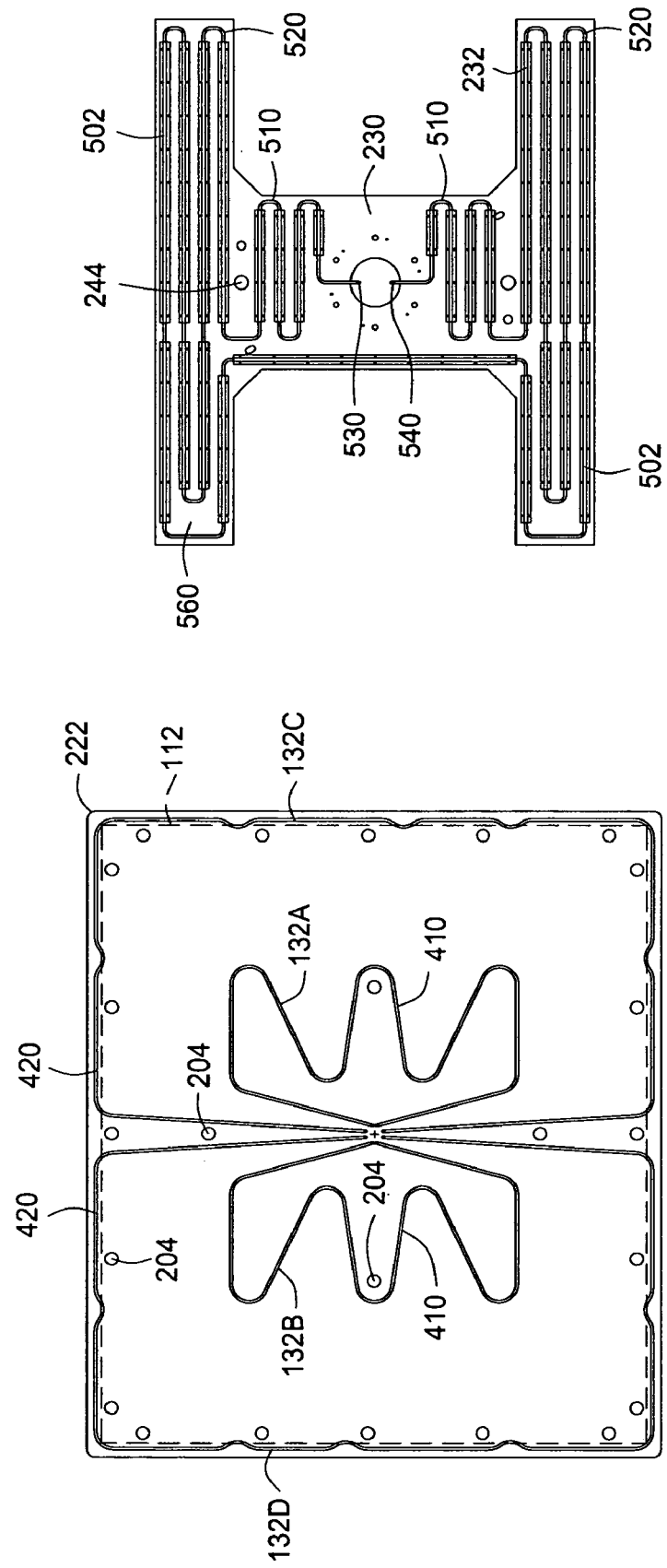
FIG. 7A is a planar view of a susceptor in accordance with one embodiment of the invention.
FIG. 7B is a planar view of a cooling plate having cooling channels attached thereto in accordance with one embodiment of the invention.

FIG. 7A illustrates one exemplary configuration of the one or more heating elements 132. As an example, heating elements 132A and 132B may enter the susceptor 222 through the shaft 187, loop around center regions of the susceptor 222 in one or more inner heating loops 410, and exit through the shaft 187, whereas heating elements 132C and 132D may loop around an outer perimeter of the susceptor 222 in one or more outer heating loops 420. The routing of the one or more heating elements 132 (e.g., the heating elements 132A-132D) inside the susceptor 222 provides dual and somewhat generally parallel loops running along inner and outer regions of the susceptor 222. This dual loop pattern provides for a generally axially-symmetric temperature distribution across the susceptor 222, while compensating for heat losses at outside edges of the substrate 112.

The inner heating loops 410 and the outer heating loops 420 of the heating elements 132A-132D provide uniform substrate temperature control and each of the heating elements 132A-132D may operate at different controlled temperatures. For example, the outer heating loops 420 can be operated at a higher temperature to compensate heat loss at the outer edges of the susceptor 222. In addition, one or more thermocouples (not shown) can be used within the substrate support assembly 104. In one embodiment, two thermocouples are embedded in the susceptor 222, such as one for the center region and one for the outer perimeter of the susceptor 222. However, other heater lines or channel configurations can also be used. For example, the heating element 132 can also be positioned to the back side of the susceptor 222 or clamped onto the susceptor 222 by a clamp plate.

The susceptor 222 of the invention includes the substrate support pin holes 204 adapted to align with the substrate support pins 202 and may further include additional alignment mechanisms, such as one or more alignment pins 224 adapted to align the substrate support assembly 104 to the shadow framel 58. The alignment pins 224 can be made of an insulating material, such as ceramic materials, anodized aluminum oxides materials, engineering plastics, among others, in order to insulate the heated susceptor 222 from the shadow frame 158, chamber sidewalls 152, and other chamber components.

According to one or more embodiments of the invention, the cooling plate 230 is positioned below the susceptor 22. The cooling plate 230 includes a front side surface 550 facing the susceptor 222, as shown in FIG. 5, and a back side surface 560 facing the susceptor base support structure 234, as shown in FIG. 7B. In general, the cooling plate 230 provides structural support for the one or more cooling channels 232 and the one or more cooling channels 232 can be positioned to the front side surface 550 or the back side surface 560 of the cooling plate 230. In one embodiment of the invention, the one or more cooling channels 232 are positioned to the back side surface 560 of the cooling plate 230 and between the cooling plate 230 and the susceptor base support structure 234. In another embodiment, heat transfer between the susceptor 222 and the cooling plate 230 can be controlled through the front side surface 550 of the cooling plate 230 and/or the thickness of the cooling plate 230.

For example, the cooling plate 230 can be placed a small gap (distance) "D" below the susceptor 222 by configuring the front side surface 550 at different vertical positions. The distance "D" can range between about 1 mm to about 25 mm. In addition, the cooling plate 230 can have a thickness between about 1 mm to about 25 mm. As another example, the front side surface 550 of the cooling plate 230 may include surface finishing or may be roughened by surface roughening materials 570 on specific locations to further provide adjustable emissivity for heating and cooling temperature control. The surface roughening materials 570 may be the same or different material as the cooling plate 230, such as stainless steel, aluminum, anodized aluminum oxide, etc., and can be applied by any bonding techniques, such as welding, sand blasting, among others. A smoothly finished surface can provide higher heat transfer (higher heating and cooling efficiency) and a rough surface and lower heat transfer can avoid too much cooling to the susceptor 222. The surface roughening materials 570 can have a surface roughness of between about 330 to about 2000 micro-inches. One example of surface roughening is described in the co-pending patent application, Ser. No. 11/167,377 (docket number: AMAT/10172) filed on Jun. 27, 2005, titled "Process Kit Design to Reduce Particle Generation" by Le et al., which is incorporated by reference herein, to the extent consistent with the invention. As a result, contact resistance, emissivity, and heat transfer between the susceptor 222 and the cooling plate 230, and thus, the heating and cooling efficiencies of the substrate support assembly 104 of the invention can be controlled.

FIG. 7B illustrates the back side surface 560 of the cooling plate 230 having the one or more cooling channels 232 attached thereto according to one or more aspects of the invention. Alternatively, the one or more cooling channels 232 can be attached to the front side surface 550 of the cooling plate. A plurality of attachment mechanisms 502 can be used to secure the one or more cooling channels 232 to the cooling plate 230. The diameter of the one or more cooling channels 232 is not limited and can be any suitable diameters, such as between about 1 mm to about 15 mm, e.g., about 9 mm. In addition, the one or more cooling channels 232 can be made of a metal or metal alloy material which provides thermal conductivity. In one embodiment, the one or more cooling channels 232 are made of a stainless steel material. However, other suitable materials or configurations can also be used.

The cooling fluids may be channeled in and out from the shaft 187 of the process chamber 100 through an in-flow channel 530 and an out-flow channel 540. In addition, the one or more cooling channels 232 may be configured into one or more looped structures, having shorter inner cooling loops 510 and longer outer cooling loops 520. In one embodiment, the one or more cooling channels 232 are adapted to be positioned along the perimeter of two opposite edges, such as the outer cooling loops 520 shown in FIG. 7B. The outer cooling loops 520 from the two opposite edges are connected by the inner cooling loops 510.

In another embodiment, the outer cooling loops 520 are spaced between the inner heating loops 410 and the outer heating loops 420 of the heating elements 132A-132D. Further, the inner cooling loops 510 are adapted to loop through a central region of the cooling plate 230 near the shaft 187, as more clearly illustrated in FIG. 7D, relative to a region surrounded by the inner heating loops 410 of the heating elements 132A-132D, where higher temperature may be exhibited in the susceptor 222 and, thus, more cooling channel distribution may be needed. Overall, the inner cooling loops 510 and the outer cooling loops 520 can be parallel to each other. In addition, neighboring loops of the inner cooling loops 510 and the outer cooling loops 520 may loop in opposite flow directions.

In still another embodiment, the inner cooling loops 510 and the outer cooling loops 520 of the cooling channels 232 are adapted to avoid interference with the one or more substrate support pins 202 and configured to space apart from one or more substrate support pin holes, including the substrate support pin holes 204 on the susceptor 222 and one or more substrate support pin holes 244 on the cooling plate 230, etc. These substrate support pin holes are configured for the substrate support pins 202 to passthrough.

The one or more cooling channels 232 are adapted to flow cooling fluids therein, such as water, coolants, air, gaseous materials, and other suitable cooling gases or liquid materials therein. Suitable gaseous materials may include clean dry air, compressed air, filtered air, nitrogen gas, hydrogen gas, inert gas (e.g., argon gas, helium gas, etc.), and other gases. As an example, cooling water at a temperature of about 30° C. or less, such as from about 20° C. to about 25° C. can be used to provide temperature cooling control. Flowing cooling water inside the one or more cooling channels 232 is easy, convenient, and beneficial since water is a good coolant with its generally high heat capacity (Cp, watts per kilograms per ° C.) to absorb heat.

Further, the cooling fluids flowing inside the one or more cooling channels 232 can be operated at a controlled flow rate to control cooling efficiency during substrate processing when the substrate 112 is heated by the one or more heating elements 132 and/or during chamber idle time or chamber maintenance. For example, a flow rate of about 1 gallon per minute (gpm) of cooling water, such as between about 1 gpm to about 2 gpm, can be used to flow into the one or more cooling channels 232. As a result, sufficient temperature control of the substrate support assembly is provided to maintain the substrate 112 at a uniform temperature of between about 80° C. to about 200° C. during substrate processing without temperature variation or temporal temperature spike.

In one embodiment, the one or more cooling channels 232 are configured to maintain temperature control and compensate temperature variation which may occur during substrate processing, such as a temperature increase or spike when a RF plasma is generated inside the process chamber 100. In another embodiment, the one or more cooling channels 232 are provided to rapidly cool down the temperature inside the process chamber 100 during chamber maintenance by supplying cooling fluids at high flow rate to the cooling channels 232 inside the substrate support assembly 104 of the invention.

Figure 7D:
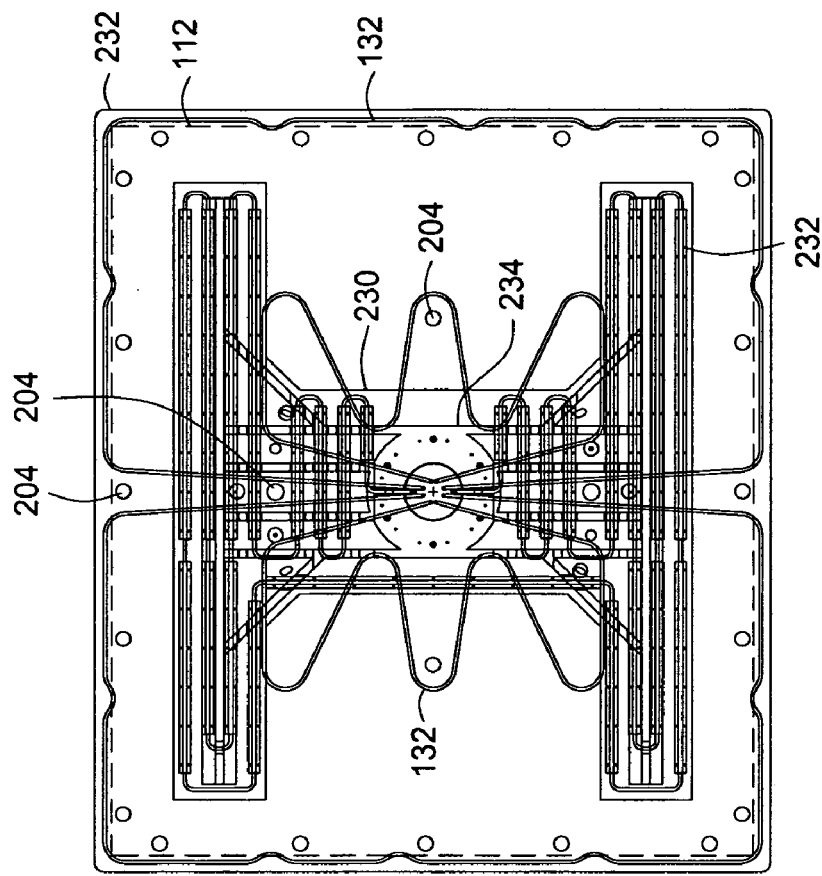
FIG. 7D is another view of a substrate support assembly according to one embodiment of the invention.
Figure 7C:
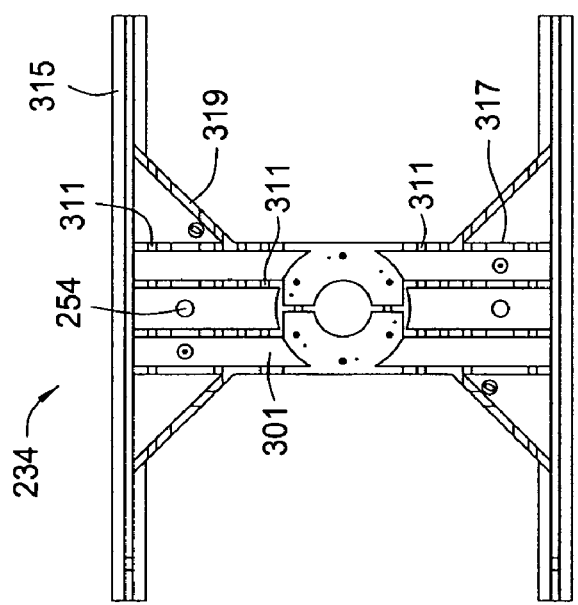
FIG. 7C is a planar view of a support plate in accordance with one embodiment of the invention.

FIG. 7C illustrate one exemplary structure of the susceptor base support structure 234 and FIG. 7D shows a top view of the substrate support assembly 104 of the invention where key components are superimposed on top of each other, in accordance with one or more aspects of the invention. In general, the susceptor base support structure 234 provides structural support to the susceptor 222 and the substrate 112 thereon to prevent them from deflecting due to gravity and high temperature and to ensure relatively uniform contact between the susceptor 222 and the substrate 112.

The susceptor base support structure 234 may include a main body 301, one or more elongated base support beams 315, a plurality of lateral support beams 317, and a plurality of cross support beams 319 that are adapted to support the susceptor 222 and the one or more cooling channels 232. In one aspect, it is preferred that the base support beams 315, lateral support beams 317, and the cross support beams 319 are fabricated from a material of sufficient strength and rigidity to support and retain the weight and shape of the substrate support assembly 104 under the processing temperature and pressure conditions. In one embodiment, the components of the susceptor base support structure 234 are made from stainless steel and fabricated by welding, sand blasting, and other binding techniques known in the art.

It is understood that the one or more cooling channels 232 and/or the cooling plate 230 may rest on the susceptor base support structures 234. It is contemplated that the susceptor base support structures 234 may include a plurality of grooves 311 for the one or more cooling channels 232 to rest on such that the one or more cooling channels 232 do not move relative to each other during processing. In addition, while two base support beams 315 and four separate lateral support beams 317 are shown in FIG. 7C, it is to be understood that any number of support beams may be used.

In another aspect, reinforcement in the thicknesses of the elongated base support beams 315, the lateral support beams 317, and the cross support beams 319, which translate to a height 515 raised above the main body 301, as illustrated in FIG. 6, is provided to obtain sufficient mechanical strength and structural rigidity for the susceptor base support structures 234. Preferably, the height 515 of the base support beams 315, lateral support beams 317, and the cross support beams 319 is ranged from about 0.4 mm to about 3.5 mm.

In one embodiment, the elongated base support beams 315 are positioned along the perimeter of two opposite edges and configured to align with and support the outer cooling loops 520 of the one or more cooling channels 232, whereas the lateral support beams 317 and the cross support beams 319 are spaced between the elongated base support beams 315 and positioned to support the inner cooling loops 510 of the one or more cooling channels 232.

In another embodiment, the elongated base support beams 315, the lateral support beams 317, and the cross support beams 319 are adapted to avoid interference with the one or more substrate support pins 202 and configured to space apart from one or more substrate support pin holes 254 on the main body 301 configured for the substrate support pins 202 to passthrough the main body 301 of the susceptor base support structures 234.

Accordingly, the substrate support assembly 104 of the invention provides a simple design with the susceptor 222, the cooling plate 230, and the one or more cooling channels 232 function together to control the temperature of the large area substrate without the use of an electrostatic chuck. Applying any pressure, gas, or fluid to the back side of the substrate to vacuum chuck a large area glass substrate may easily lead to glass breakage.

Figure 8:
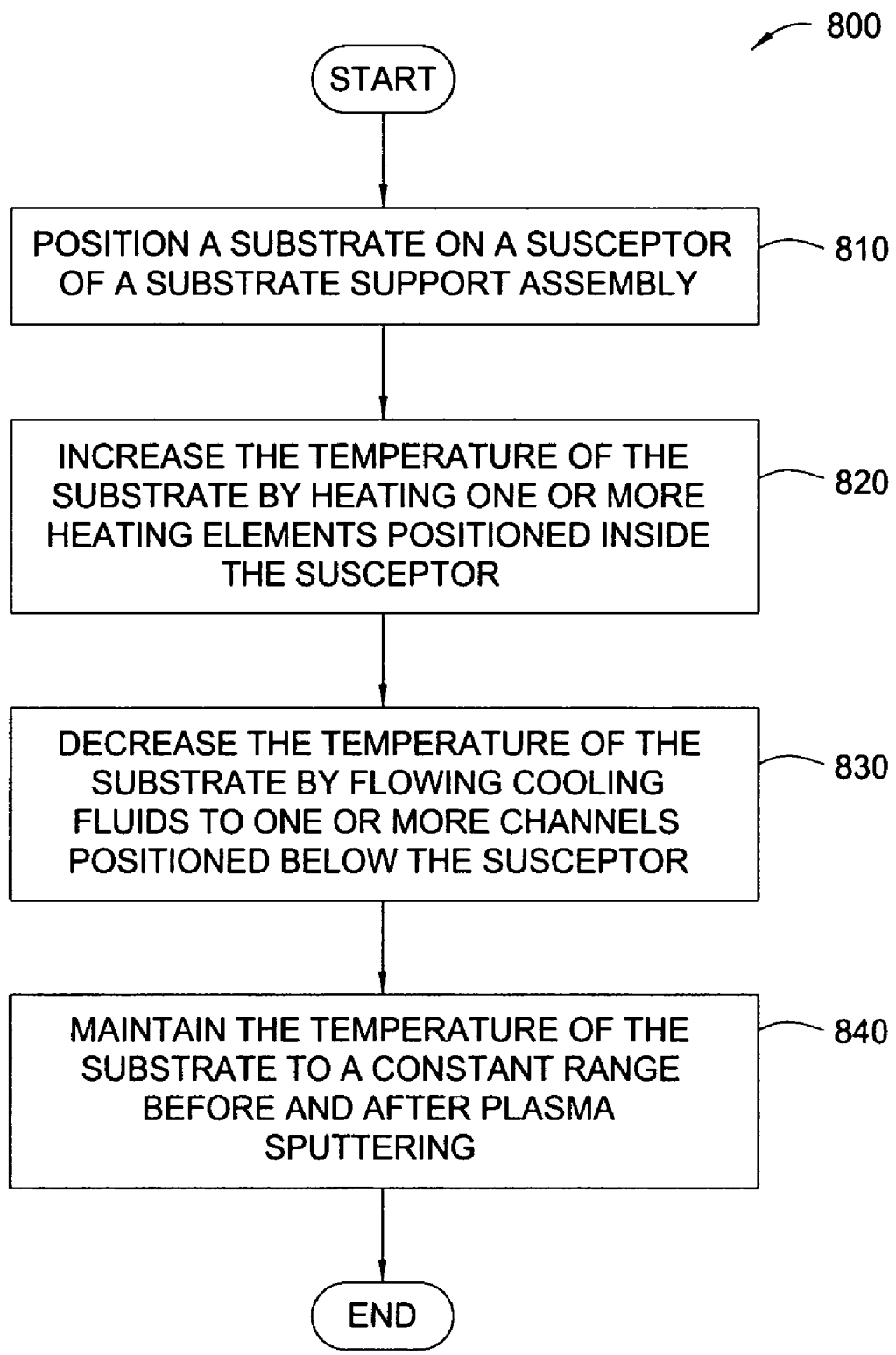
FIG. 8 is a flow diagram of one embodiment of a method for controlling the temperature of a substrate within a process chamber.

FIG. 8 is a flow diagram of one exemplary method for controlling the temperature of a substrate within a process chamber. In operation, the substrate is positioned on a susceptor of a substrate support assembly inside the process chamber at step 810. Before and/or during substrate processing, the temperature of the substrate is increased at step 820 by heating one or more heating elements positioned inside the susceptor. At step 830, the temperature of the substrate is decreased by flowing cooling fluids to one or more cooling channels, such as the one or more cooling channel 232. In one embodiment, the one or more cooling channels are spatially separated from the heating element. In another embodiment, the cooling channels are positioned between a cooling plate and a susceptor base support structure and below the susceptor having the one or more heating elements therein.

At step 840, the temperature of the substrate can be maintained to a constant temperature range before and after plasma sputtering. In one embodiment, the temperature of the substrate can be maintained to a constant process temperature of about 200° C. or less, such as between about 100° C. and about 150° C. across the entire surface of the substrate. In another embodiment, the temperature of the substrate 112 is kept constant, having a normalized temperature variation of about +/−10° C., such as about +/−5° C. normalized temperature variation.

For example, the flow rate of the cooling fluids inside the cooling channels is controlled during substrate processing and the temperature of the substrate is maintained constant without any temperature spike or variation regardless of whether a plasma is used to sputter target materials onto the substrate since heat generated from the energy of the plasma can be cooled off using the cooling channels and can not affect the temperature of the surface of the substrate or the susceptor. In operation, cooling fluids, such as cold water or any coolants, are flowed into the cooling channels, e.g., the cooling channels 232, and the flow rate of the cooling fluids are adjusted to maintain a constant temperature on the substrate 112.

Alternatively, the temperature of the substrate is maintained constantly during substrate processing by adjusting the heating efficiency of one or more heating elements embedded in the susceptor of the substrate support assembly and keeping the cooling fluids flown into one or more cooling channels at a constant flow rate. For example, the temperature of the substrate can be maintained to a constant process temperature of about 100° C. to about 150° C. across the entire surface of the substrate by fine-tuning the power level of the heating power source for the heating elements regardless of whether a plasma is induced or any additional heat generated from the energy of the plasma in order to prevent any temperature spike or variation on the surface of the substrate. In operation, the heating efficiency of the one or more heating elements can be adjusted by adjusting various power levels provided to the one or more heating elements. As a result, one control loop may be need for software designs within the controller 190 for adjusting the heating efficiency. If needed, two or more control loops for adjusting both heating and cooling efficiencies can be employed.

In addition, the use of separate cooling and separate heating sources spaced apart is advantageous, as compared to having the heating element and cooling element configured into one body. For example, each component for the heating and cooling sources, the heating element, and/or the cooling channels can be easily and separately manufactured. Further, each heating or cooling component, e.g., the susceptor 222, the cooling plate 230, or the cooling channels 232, can be easily replaced as needed. Accordingly, the invention provides a flexible and reliable substrate support assembly and enables various adjustable temperature control mechanisms for heating and/or cooling of the substrate support assembly.

Although several preferred embodiments which incorporate the teachings of the present invention have been shown and described in detail, those skilled in the art can readily devise many other varied embodiments that still incorporate these teachings. While the foregoing is directed to embodiments of the present invention, other and further embodiments of the invention may be devised without departing from the basic scope thereof, and the scope thereof is determined by the claims that follow.

We claim:

1. A substrate support assembly adapted to support a large area substrate inside a process chamber, comprising:
   a thermally conductive body comprising a stainless steel material;
   a substrate support surface on the surface of the thermally conductive body and adapted to support the large area substrate thereon;
   one or more heating elements embedded within the thermally conductive body;
   a cooling plate positioned below the thermally conductive body;
   a base support structure comprising a stainless steel material, positioned below the cooling plate and adapted to structurally support the thermally conductive body; and
   one or more cooling channels adapted to be supported by the base support structure and positioned between the cooling plate and the base support structure, wherein the one or more cooling channels comprise one or more inner cooling loops and one or more outer cooling loops, and wherein the neighboring cooling loops of the one or more cooling channels comprises cooling fluid flowing at opposite flow directions.

2. A substrate support assembly adapted to support a large area substrate inside a process chamber, comprising:
   a thermally conductive body comprising a stainless steel material;
   a substrate support surface on the surface of the thermally conductive body and adapted to support the large area substrate thereon;
   one or more heating elements embedded within the thermally conductive body;
   a cooling plate positioned below the thermally conductive body;
   a base support structure comprising a stainless steel material, positioned below the cooling plate and adapted to structurally support the thermally conductive body; and
   one or more cooling channels adapted to be supported by the base support structure and positioned between the cooling plate and the base support structure, wherein the one or more cooling channels comprise one or more inner cooling loops and one or more outer cooling loops, and wherein the one or more heating elements comprise one or more inner heating loops and one or more outer heating loops, and the one or more outer cooling loops of the one or more cooling channels are spaced between the one or more inner heating loops and the one or more outer heating loops of the one or more heating elements.

3. A substrate support assembly adapted to support a large area substrate inside a process chamber, comprising:
   a thermally conductive body comprising a stainless steel material;
   a substrate support surface on the surface of the thermally conductive body and adapted to support the large area substrate thereon;
   one or more heating elements embedded within the thermally conductive body;
   a cooling plate positioned below the thermally conductive body;
   a base support structure comprising a stainless steel material, positioned below the cooling plate and adapted to structurally support the thermally conductive body; and
   one or more cooling channels adapted to be supported by the base support structure and positioned between the cooling plate and the base support structure, wherein the base support structure comprises one or more elongated base support beams positioned to support the one or more cooling channels and the thermally conductive body along the perimeter of two opposite edges of the substrate support surface.

4. A substrate support assembly adapted to support a large area substrate inside a process chamber, comprising:
   a thermally conductive body comprising a stainless steel material;
   a substrate support surface on the surface of the thermally conductive body and adapted to support the large area substrate thereon, wherein the substrate support surface is adapted to be rectangular in shape to support a large area rectangular substrate of about one square meter or larger;
   one or more heating elements embedded within the thermally conductive body;
   a cooling plate positioned below the thermally conductive body;
   a base support structure comprising a stainless steel material, positioned below the cooling plate and adapted to structurally support the thermally conductive body; and
   one or more cooling channels adapted to be supported by the base support structure and positioned between the cooling plate and the base support structure.

5. A substrate support assembly adapted to support a large area substrate inside a process chamber, comprising:
   a thermally conductive body comprising a stainless steel material;
   a substrate support surface on the surface of the thermally conductive body and adapted to support the large area substrate thereon;
   one or more heating elements embedded within the thermally conductive body;
   a cooling plate positioned below the thermally conductive body, wherein a front side surface of the cooling plate facing the thermally conductive body further comprises surface roughening materials;
   a base support structure comprising a stainless steel material, positioned below the cooling plate and adapted to structurally support the thermally conductive body; and
   one or more cooling channels adapted to be supported by the base support structure and positioned between the cooling plate and the base support structure.

6. A process chamber for processing a large area substrate therein, comprising:
   a substrate support assembly adapted to support the large area substrate, comprising:
   a thermally conductive body comprising a stainless steel material;
   a substrate support surface on the surface of the thermally conductive body and adapted to support the large area substrate thereon, wherein the substrate support surface is configured to support one or more large area rectangular substrates for fabricating devices selected from the group consisting of flat panel display (FPD), organic light emitting diode (OLED) displays, flexible organic light emitting diode (FOLED) display, polymer light emitting diode (PLED) display, liquid crystal displays (LCD), organic thin film transistor, active matrix, passive matrix, top emission device, bottom emission device, solar cell, solar panel, and combinations thereof;

one or more heating elements embedded within the thermally conductive body;

a cooling plate positioned below the thermally conductive body;

a base support structure comprising a stainless steel material, positioned below the cooling plate and adapted to structurally support the thermally conductive body; and one or more cooling channels positioned between the cooling plate and the base support structure;

a chamber body having chamber side walls and a chamber bottom; and a target assembly positioned above the substrate support assembly.

* * * * *

UNITED STATES PATENT AND TRADEMARK OFFICE
CERTIFICATE OF CORRECTION

PATENT NO.         : 7,429,718 B2  
APPLICATION NO.    : 11/213348  
DATED              : September 30, 2008  
INVENTOR(S)        : Inagawa et al.

Page 1 of 1

It is certified that error appears in the above-identified patent and that said Letters Patent is hereby corrected as shown below:

Column 1, Line 61, please delete "defied" and insert --deflect-- therefor;

Column 6, Line 34, please delete "susoeptor" and insert --susceptor-- therefor;

Column 8, Line 67, please delete "framel 58" and insert --frame 158-- therefor.

Signed and Sealed this

Seventeenth Day of February, 2009

JOHN DOLL  
*Acting Director of the United States Patent and Trademark Office*